United States Patent
Geuppert

(10) Patent No.: US 10,635,003 B2
(45) Date of Patent: Apr. 28, 2020

(54) LITHOGRAPHY SYSTEM AND METHOD

(71) Applicant: Carl Zeiss SMT GmbH, Oberkochen (DE)

(72) Inventor: Bernhard Geuppert, Aalen (DE)

(73) Assignee: Carl Zeiss SMT GmbH, Oberkochen ( * ) Notice: Subject to any disclaimer, the term of this patent is extended or adjusted under 35 U.S.C. 154(b) by 0 days.

(21) Appl. No.: 16/443,365

(22) Filed: Jun. 17, 2019

(65) Prior Publication Data

US 2019/0310557 A1     Oct. 10, 2019

Related U.S. Application Data

(63) Continuation of application No. PCT/EP2017/078490, filed on Nov. 7, 2017.

(30) Foreign Application Priority Data

Dec. 21, 2016    (DE) .................. 10 2016 225 707

(51) Int. Cl.
     *G03B 27/54*      (2006.01)
     *G03F 7/20*      (2006.01)

(52) U.S. Cl.
    CPC .......... *G03F 7/70191* (2013.01); *G03F 7/708* (2013.01); *G03F 7/709* (2013.01); *G03F 7/7015* (2013.01); *G03F 7/7085* (2013.01); *G03F 7/70258* (2013.01); *G03F 7/70833* (2013.01)

(58) Field of Classification Search
    CPC ............... G03F 7/7015; G03F 7/70191; G03F 7/70258; G03F 7/708; G03F 7/70833; G03F 7/7085; G03F 7/709
    See application file for complete search history.

(56) References Cited

U.S. PATENT DOCUMENTS

| | | |
|---|---|---|
| 2005/0140950 A1 | 5/2005 | Franken et al. |
| 2006/0139598 A1 | 6/2006 | Van Dijsseldonk et al. |
| 2015/0062596 A1 | 3/2015 | Kwan et al. |

FOREIGN PATENT DOCUMENTS

| | | |
|---|---|---|
| EP | 1 465 015 A1 | 10/2004 |
| WO | WO 2013/178277 A1 | 12/2013 |
| WO | WO 2016/087177 A1 | 6/2016 |
| WO | WO 2016/139012 A1 | 9/2016 |

OTHER PUBLICATIONS

International Search Report and Written Opinion for corresponding PCT Appl No. PCT/EP2017/078490, dated Jan. 29, 2018.

*Primary Examiner* — Peter B Kim
(74) *Attorney, Agent, or Firm* — Fish & Richardson P.C.

(57) ABSTRACT

A lithography system has a projection lens that includes a first optical element and a first sensor subframe. The projection lens also includes first sensor which is configured to detect a position of the first optical element with respect to the first sensor subframe. The projection lens further includes a second sensor which is configured to detect a position of a wafer with respect to the first sensor subframe.

20 Claims, 8 Drawing Sheets

LITHOGRAPHY SYSTEM AND METHOD

CROSS-REFERENCE TO RELATED APPLICATIONS

The present application is a continuation of, and claims benefit under 35 USC 120 to, international application PCT/EP2017/078490, filed Nov. 7, 2017, which claims benefit under 35 USC 119 of German Application No. 10 2016 225 707.2, filed Dec. 21, 2016. The entire disclosure of these applications are incorporated by reference herein.

FIELD

The present disclosure relates to a lithography system and a method for producing a projection lens.

BACKGROUND

Microlithography is used for producing microstructured components, for example integrated circuits. The microlithographic process is carried out with a lithography apparatus, which has an illumination system and a projection system. The image of a mask (reticle) illuminated via the illumination system is in this case projected via the projection system onto a substrate (for example a silicon wafer) coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses that use light with a wavelength in the range of 0.1 nm to 30 nm, in particular 13.5 nm. In the case of such EUV lithography apparatuses, because of the high absorption of light of this wavelength by most materials, reflective optical units, that is to say mirrors, have to be used instead of—as previously—refractive optical units, that is to say lens elements.

The positions of the mirrors which are arranged in a projection system for defining a beam path can be detected with the aid of sensors. In this case, the sensors are mounted for example on a mirror or on a sensor frame, wherein the position of the mirror relative to the sensor frame can be detected. A sensor frame can be divided into a plurality of oscillation-decoupled sensor subframes. By virtue of a plurality of sensor subframes being provided, the sensor subframes can have intrinsically smaller dimensions or a reduced mass. This reduces the quasi-static deformation as a result of low-frequency dynamic excitation at the system and thus an image oscillation. If a plurality of sensor subframes are present which are referenced to one another, a corresponding measurement complexity arises, which results in measurement inaccuracies. Furthermore, alignment inaccuracies between the sensor subframes can occur.

WO 2013/178277 A1 discloses a projection system having two sensor subframes, to which in each case three optical elements are referenced with the aid of sensors. Furthermore, the sensor subframes have additional sensors in order to detect position data between the sensor subframes.

SUMMARY

The present disclosure seeks to provide an improved lithography system and an improved method for producing a projection lens.

Accordingly, a lithography system is proposed. The lithography system includes a projection lens. The projection lens includes a first optical element, a first sensor subframe, a first sensor, which is configured to detect a position of the first optical element with respect to the first sensor subframe, and a second sensor, which is configured to detect a position of a wafer with respect to the first sensor subframe.

By virtue of detecting the position of the first optical element and the position of the wafer with respect to a single sensor subframe, it is possible to avoid a measurement error that would occur between two sensor subframes referenced to one another. For the case where the projection lens includes only the first sensor subframe and no further sensor subframe (that is to say no divided sensor frame), the first sensor subframe can also be referred to as "one", if appropriate also "a single" sensor frame. The sensor frame is integral, for example. This has the advantage that no sensor subframes need be referenced to one another, such that the metrology associated with this is obviated. Furthermore, measurement and alignment errors that occur when referencing a plurality of sensor subframes to one another are eliminated. Preferably, the projection lens includes a multiplicity of optical elements and a multiplicity of sensors configured to detect positions of the multiplicity of optical elements related to that first sensor subframe. By way of example, the projection lens includes at least or exactly 2, 3, 4, 5, 6, 7, 8, 9, 10, 11, 12, 13 or 14 optical elements that are referenced to the first sensor subframe.

In accordance with one embodiment, the lithography system includes the wafer. Furthermore, the projection lens includes the first optical element, a second optical element, the first sensor subframe and a second sensor subframe, which are oscillation-decoupled from one another, a third sensor, which is configured to detect a position of the first optical element with respect to the second sensor subframe.

Position sensors in lithography systems are blind in such a range in which the difference between actual and setpoint positions of the monitored optical element, wafer and/or reticle does not exceed a specific threshold value (in the present case also referred to as measurement error). Furthermore, the measurement error is influenced by measurement noise. Such measurement errors can add up, depending on the design of the measurement and of the lithography system. This can ultimately have the consequence of erroneous guiding of the monitored optical element, wafer and/or reticle via a corresponding actuator.

What is advantageous in accordance with this embodiment is that incorrect positionings of the monitored optical elements, of the wafer and/or of the reticle (also referred to jointly as elements) in relation to the image effect jointly achieved by these elements mutually compensate for one another. Effects of such incorrect positionings are described with the aid of the so-called line-of-sight sensitivity (so-called LoS sensitivity; definition below).

This insight can be used to the effect that the measurement errors of the position sensors are accorded a lesser significance because the incorrect positionings of the monitored optical elements, of the wafer and/or of the reticle have a lesser effect in the imaging. To that end, the measurement is designed such that the LoS sensitivities within a group of elements which is assigned to a sensor subframe as measurement reference compensate for one another as much as possible. This is achieved in particular by virtue of the fact that the third sensor detects the position of the first optical element with respect to the second sensor subframe, and the first sensor detects the position of the first optical element with respect to the first sensor subframe, and the second sensor likewise detects the position of the wafer with respect to the first sensor subframe.

Advantageously, the lithography system includes an EUV lithography apparatus, in which a wavelength of the working light is in particular between 0.1 and 30 nm, or a DUV lithography apparatus, in which the wavelength of the working light is in particular between 30 and 250 nm, with the projection lens.

The LoS sensitivity for shifts is defined as follows: LoS=(s μm)/(1 μm). Furthermore, the LoS sensitivity for tilts is defined as follows: LoS=(s μm)/(1 μrad). If an optical element, a reticle or a wafer is shifted by 1 μm or tilted by 1 μrad, then the image shifts by s μm. Preferably, an LoS sensitivity is determined for a constant numerical aperture.

A "position" of one element with respect to another element means in the present case that position data between the two elements are detected which allow a conclusion to be drawn about the location of the two elements with respect to one another in up to 6 degrees of freedom. In other words, it is possible to draw a conclusion about distances between the two elements in up to three spatial directions, which are for example perpendicular to one another, and about tilts of the two elements with respect to one another by up to three rotation axes.

An "optical element" is for example a mirror, a lens element, an optical grating or a lambda plate.

A "sensor frame" means in the present case a structure with respect to which position data of one or more elements, which can be embodied as optical elements, reticles and/or wafers, are determined. The sensor frame can be divided into a plurality of sensor subframes that are oscillation-decoupled from one another. Sensors or parts of the sensors can be connected to the sensor subframe. "Frame" in the present case does not necessarily presuppose a frame-shaped structure, but rather also encompasses for example a platform or a plate. The sensor subframes are embodied in a rigid fashion. In this case, a sensor subframe can include one or more of the following materials: silicon carbide (SiC), reaction-bonded silicon-infiltrated silicon carbide (SiSiC), cordierite, aluminium oxide ($Al_2O_3$), aluminium nitride (AlN), glass ceramics such as Zerodur, titanium silicate glass (also known as ULE™) etcetera, steel, aluminium or other metals and alloys. More than two sensor subframes, for example a third and/or a fourth sensor subframe, can be provided.

"Oscillation decoupling" should be understood to mean that virtually no forces, vibrations and/or oscillations are transmitted from one sensor subframe to another sensor subframe, or vice versa. This can be achieved for example via a very soft and/or resilient mounting of the sensor subframes.

A "sensor" in the present case can also include a plurality of subsensors (e.g. one subsensor for each spatial direction) that detect data separately from one another, with the aid of which it is possible to draw conclusions about the position of one element with respect to another element. The sensor is embodied for example as a capacitive or optical sensor. The sensor can include a transmitter and a receiver, which can be realized in one unit. Consequently, the sensor can be mounted only on a first element ("element" here denotes optical element, wafer or reticle and/or sensor subframe). The second (monitored) element then itself serves as a measurement object (e.g. reflector of light). Alternatively, the transmitter is mounted on a first element and the receiver is mounted on a second element, wherein a position of the second element with respect to the first element is detected. In this case, the receiver is the measurement object.

In accordance with a further embodiment, the first and second optical elements at least partly define a beam path of the projection lens. The first optical element is arranged as the last optical element in the beam path upstream of the wafer.

This has the advantage that the position of the last optical element and the position of the wafer are detected with respect to a single sensor subframe, such that the LoS sensitivity of the wafer and of the last optical element with respect to remaining beam path defining elements is reduced. Preferably, the projection lens includes 4 to 12 optical elements. "Beam path" in the present case is understood to mean the geometric course of light rays towards a target object, for example a wafer to be exposed. Furthermore, "working light" is understood to mean the light that radiates from a light source indirectly or directly towards an optical element and serves for an exposure of the wafer. The wavelength of the working light is in particular between 0.1 and 30 or 30 and 250 nm.

In accordance with a further embodiment, the projection lens includes a third optical element, which further defines the beam path, and a fourth sensor, which is configured to detect a position of the third optical element with respect to the first sensor subframe. The third optical element is arranged as the penultimate optical element in the beam path.

Consequently, the position of the last optical element, the position of the penultimate optical element and the position of the wafer are detected with respect to a single sensor subframe. A group of elements is thus referenced to a single sensor subframe. It has been found, surprisingly, that in the case of such an arrangement the LoS sensitivity of this group (including wafer, penultimate optical element and last optical element) with respect to remaining beam path defining elements is low.

In accordance with a further embodiment, the lithography system includes a reticle, wherein the projection lens includes a fifth sensor, which is configured to detect a position of the reticle with respect to the second sensor subframe.

The position of the reticle and the position of the second optical element are thus detected with respect to the same sensor subframe. Preferably, the second optical element is the element arranged at the first location in the beam path in the projection system, such that the working light from the reticle is incident directly on the second optical element. Preferably, the projection lens includes a further optical element and a further sensor, which is configured to detect a position of the further optical element, arranged in particular at the second location in the beam path. This has the advantage that a group of elements (reticle, first optical element and, if appropriate, the further optical element) are referenced to the second sensor subframe and the LoS sensitivity of this group with respect to the remaining beam path defining elements is low.

In accordance with a further embodiment, the projection lens furthermore includes a sixth sensor, which is configured to detect a position of the second sensor subframe with respect to the first sensor subframe.

This has the advantage that position data between the first and second sensor subframes, which are oscillation-decoupled from one another, can be determined at any time. Thus, the position of the first optical element with respect to the second optical element can also be detected indirectly by determined data of the third sensor, of the first sensor and of the sixth sensor being combined/computed with one another. By way of example, a measurement error that occurs as a result of a measurement of the sixth sensor leads to an incorrect positioning of the second optical element and of the reticle in an identical direction and by an identical absolute value. However, since a sum of an LoS sensitivity of the second optical element and an LoS sensitivity of the reticle is small, the incorrect positionings have a small influence on the image effect, such that this measurement error slightly increases an image vibration. "Image vibration" in the present case means for example that the image experiences a slight, in particular undesired, movement.

In accordance with a further embodiment, the projection lens furthermore includes a carrying frame, a first actuator, which is configured to position the second optical element with respect to the carrying frame, a second actuator, which is configured to position the first optical element with respect to the carrying frame, and a control device, which is configured to drive the first actuator for positioning the second optical element depending on the position detected by the third sensor, the position detected by the first sensor and the position detected by the sixth sensor, and to drive the second actuator for positioning the first optical element depending on the position detected by the first sensor.

The second optical element is thus aligned depending on the position of the first optical element. By way of example, in this case, the second actuator can have as a manipulated variable merely a setpoint position of the first optical element, which is preferably independent of the positions of the remaining optical elements. Consequently, the second optical element follows the position of the first optical element. This is particularly advantageous for the case where the first optical element is arranged at the last location in the beam path.

"Carrying frame" in the present case means a carrying structure to which at least the optical elements and the sensor subframes are linked. In this case, actuators are interposed between the carrying frame and the optical elements in order to perform targeted relative movements of the optical elements relative to the carrying frame. The sensor subframes are preferably oscillation-decoupled with respect to the carrying frame. This can be realized for example with the aid of a spring element and/or a damper element, a soft spring element and/or a soft damper element preferably being used. In particular, the carrying frame encloses a volume in which the sensor subframes are partly or completely arranged. "Partly arranged within the carrying frame" means that the carrying frame defines an enveloping surface, in particular an at least partly cylindrical enveloping surface, from which a sensor subframe section projects. The carrying frame can include or completely consist of a ceramic material or a metallic material. In particular, the carrying frame can be produced from or include a non-oxide ceramic, for example a silicon carbide.

The actuators are embodied for example as Lorenz actuators, piezoactuators or actuators with stepper motors.

In accordance with a further embodiment, the first, second and third optical elements are embodied as mirrors and/or lens elements.

In accordance with a further embodiment, the projection lens includes a mirror configuration. The mirror configuration includes six normal incidence mirrors or four normal incidence mirrors and four grazing incidence mirrors or three normal incidence mirrors and seven grazing incidence mirrors. The first, second and third optical elements are selected from the mirrors of the mirror configuration.

Consequently, the mirror configuration can for example include or consist of six normal incidence mirrors. Furthermore, the mirror configuration can for example include or consist of eight mirrors, namely four normal incidence mirrors and four grazing incidence mirrors. Furthermore, the mirror configuration can for example include or consist of ten mirrors, namely three normal incidence mirrors and seven grazing incidence mirrors.

"Normal incidence mirror" in the present case means a mirror which is arranged in the beam path in such a way that light rays of the working light that are incident on a reflective surface of the mirror have an angle of incidence of for example greater than 30°.

"Grazing incidence mirror" in the present case means a mirror that is arranged in the beam path in such a way that light rays of the working light that are incident on a reflective surface of the mirror have an angle of incidence of for example less than 30°. Consequently, light rays impinge with grazing incidence on the reflective surface of the mirror.

In accordance with a further embodiment, the first optical element has an LoS sensitivity and the wafer has an LoS sensitivity. The LoS sensitivity of the first optical element has a different sign from that of the LoS sensitivity of the wafer.

By virtue of the fact that the signs of the LoS sensitivities within a group of elements whose positions are detected with respect to the same sensor subframe are different, the LoS sensitivities can at least partly compensate for one another, such that the LoS sensitivity of this group with respect to remaining beam path defining optical elements is reduced. By way of example, an LoS sensitivity of the reticle has a different sign and a similar absolute value compared with an LoS sensitivity of the second optical element, such that these LoS sensitivities substantially compensate for one another. Consequently, the measurement error that occurs during measurements of the sixth sensor does not lead to increased image vibration.

In accordance with a further embodiment, a sum formed from the LoS sensitivity of the first optical element, of the wafer and/or of the third optical element has an absolute value of less than 0.5, less than 0.2, less than 0.1 or less than 0.01.

These absolute values preferably apply to a shift of the first optical element, of the wafer and/or of the third optical element by 1 μm. The image oscillation of the projection lens is thus reduced.

Furthermore, a method for producing a lithography system, in particular as described above, is proposed. The method includes the following steps:
a) arranging a first and second optical element for defining a beam path,
b) providing a wafer at the end of the beam path and/or a third optical element for further defining the beam path,
c) determining the LoS sensitivities of the first and second optical elements and also of the wafer and/or of the third optical element,
d) assigning the LoS sensitivities to a first and second sensor subframe in accordance with a first of N combination possibilities,
e) summing the LoS sensitivities assigned to a respective sensor subframe, provided that not just one individual LoS sensitivity is assigned,
f) storing the sums and individual LoS sensitivities,
g) repeating steps d)-f) up to and including the Nth combination possibility, h) selecting a combination possibility from the N combination possibilities depending on the stored sums and individual LoS sensitivities, i) providing sensors configured to detect a respective position of the first and second optical element and also of the wafer and/or third optical element with respect to a reference, and j) selecting the first or second sensor subframe as reference depending on the selected combination possibility.

By virtue of a combination possibility being chosen for which the sums of the LoS sensitivities are small, incorrect positions of the optical elements, of the reticle and/or of the wafer on account of measurement errors of the sensors, in particular of those which detect a position of one sensor subframe relative to another sensor subframe, in the image effect can at least partly cancel one another out, such that an image vibration is reduced.

The lithography system is a projection lens, for example. Preferably, in step i) a sensor is respectively provided which is configured to detect a position of the second sensor subframe with respect to the first sensor subframe and/or a position of the second sensor subframe with respect to a third sensor subframe and/or a position of the first sensor subframe with respect to the third sensor subframe. If further sensor subframes are present, sensors are correspondingly provided, such that a position of each sensor subframe is detected at least with respect to a further sensor subframe.

In accordance with a further embodiment, the LoS sensitivities determined in step c) have different signs.

In accordance with a further embodiment, in step h) absolute values of the sums and individual LoS sensitivities of a respective combination possibility are formed and summed in order to form a total sum.

Consequently, it is possible to determine a total LoS sensitivity for the projection lens in order to provide a comparability between the N combination possibilities.

In accordance with a further embodiment, the absolute values formed are weighted with a respective factor before the summing step.

Additional parameters can thus be introduced in order to additionally weight the LoS sensitivity of the groups formed. By way of example, design- or system-dictated boundary conditions can be included with the aid of the parameters.

In accordance with a further embodiment, in step h) that combination possibility which has the smallest total sum is selected from the N combination possibilities.

Consequently, it is possible to select an optimum solution from an LoS sensitivity consideration.

The embodiments and features described for the lithography system apply correspondingly to the proposed method, and vice versa.

The order of the method steps does not necessarily correspond to the order of the (alphabetic) enumeration. Rather, the order of the method steps can be chosen arbitrarily within the scope of the knowledge of a person skilled in the art. By way of example, a plurality of method steps can be performed in parallel.

The numerals "first, second, third, etc.", as used for example for the sensors, optical elements, sensor subframes or actuators, serve merely for better distinguishability of the respective elements and are interchangeable as desired. By way of example, the fifth sensor could also be designated as fourth sensor. That is to say that in embodiments described in the present case which include for example only the first, second, third and fifth sensors, the fifth sensor can be designated as fourth sensor.

"A(n)" in the present case should not be understood as restrictive to exactly one element. Rather, a plurality of elements, for example two, three or more, can also be provided. Any other numeral used here, too, should not be understood to the effect that a restriction to exactly the corresponding number of elements must be realized. Rather, numerical deviations upwards and downwards are possible.

Further possible implementations of the disclosure also include not explicitly mentioned combinations of features or embodiments that are described above or below with respect to the exemplary embodiments. In this respect, a person skilled in the art will also add individual aspects to the respective basic form of the disclosure as improvements or additions.

BRIEF DESCRIPTION OF THE DRAWINGS

Further configurations and aspects of the disclosure are the subject of the dependent claims and also of the exemplary embodiments of the disclosure described below. In the text that follows, the disclosure is explained in more detail on the basis of preferred embodiments with reference to the accompanying figures, in which:

EXEMPLARY EMBODIMENTS OF THE DISCLOSURE

Identical elements or elements having an identical function have been provided with the same reference signs in the figures, unless indicated to the contrary. In so far as a reference sign has a plurality of reference lines in the present case, this means that the corresponding element is present multiply. Reference sign lines pointing to concealed details are illustrated in a dashed manner. It should also be noted that the illustrations in the figures are not necessarily to scale.

Figure 1A:
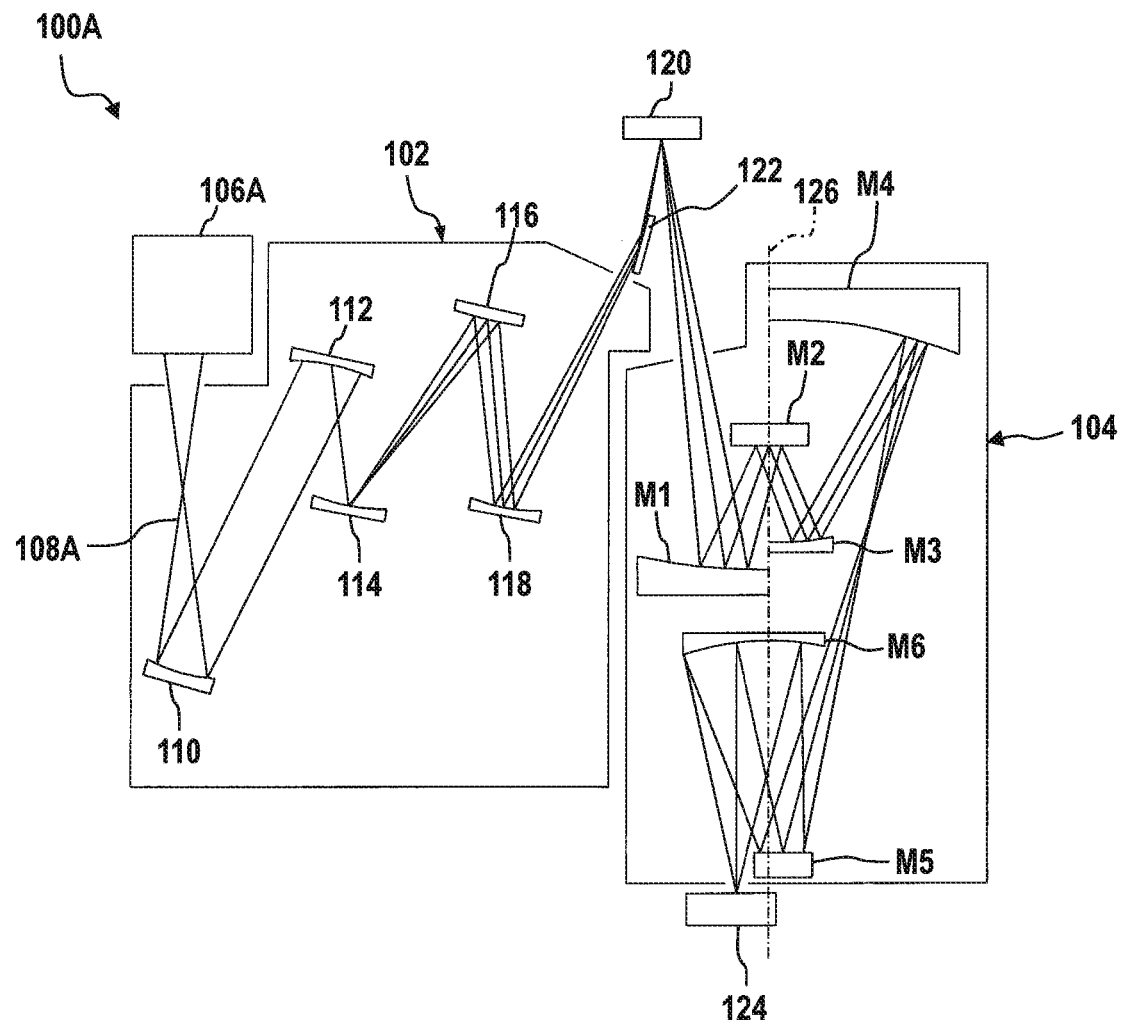
FIG. 1A shows a view of an EUV lithography apparatus.

FIG. 1A shows a schematic view of an EUV lithography apparatus 100A, which includes a beam-shaping and illumination system 102 and a projection system 104. EUV stands for "extreme ultraviolet" and refers to a wavelength of the working light of between 0.1 and 30 nm. The beam-shaping and illumination system 102 and the projection system 104 are respectively provided in a vacuum housing (not shown), the vacuum housing being evacuated with the aid of an evacuation device (not shown). The vacuum housings are surrounded by a machine room (not shown), in which the drive appliances for mechanically moving or adjusting the optical elements are provided. Moreover, electrical controllers and the like can also be provided in this machine room.

The EUV lithography apparatus 100A includes an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam-shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam-guiding spaces in the beam-shaping and illumination system 102 and in the projection system 104 are evacuated.

The beam-shaping and illumination system 102 illustrated in FIG. 1A has five mirrors 110, 112, 114, 116, 118. After passing through the beam shaping and illumination system 102, the EUV radiation 108A is directed onto the photomask (reticle) 120. The photo-mask 120 can also be designated as reticle. The photomask 120 is likewise formed as a reflective optical element and can be arranged outside the systems 102, 104. Furthermore, the EUV radiation 108A can be directed onto the photomask 120 via a mirror 122. As can be seen in FIG. 1A, the mirror 122 is embodied as a grazing incidence mirror since the EUV radiation 108A impinges with grazing incidence on a reflective surface of the mirror. The photomask 120 has a structure which is imaged onto a wafer 124 or the like in a reduced fashion via the projection system 104.

The projection system 104 (also referred to as projection lens) has six mirrors M1 to M6 for imaging the photomask 120 onto the wafer 124. In this case, individual mirrors M1 to M6 of the projection system 104 can be arranged symmetrically in relation to the optical axis 126 of the projection system 104. It should be noted that the number of mirrors of the EUV lithography apparatus 100A is not restricted to the number represented. A greater or lesser number of mirrors can also be provided. Furthermore, the mirrors are generally curved on their front face for beam shaping. In another embodiment, the projection system 104 can be embodied without an optical axis, wherein one or more mirrors M1 to M6 are embodied as freeform surfaces.

Figure 1B:
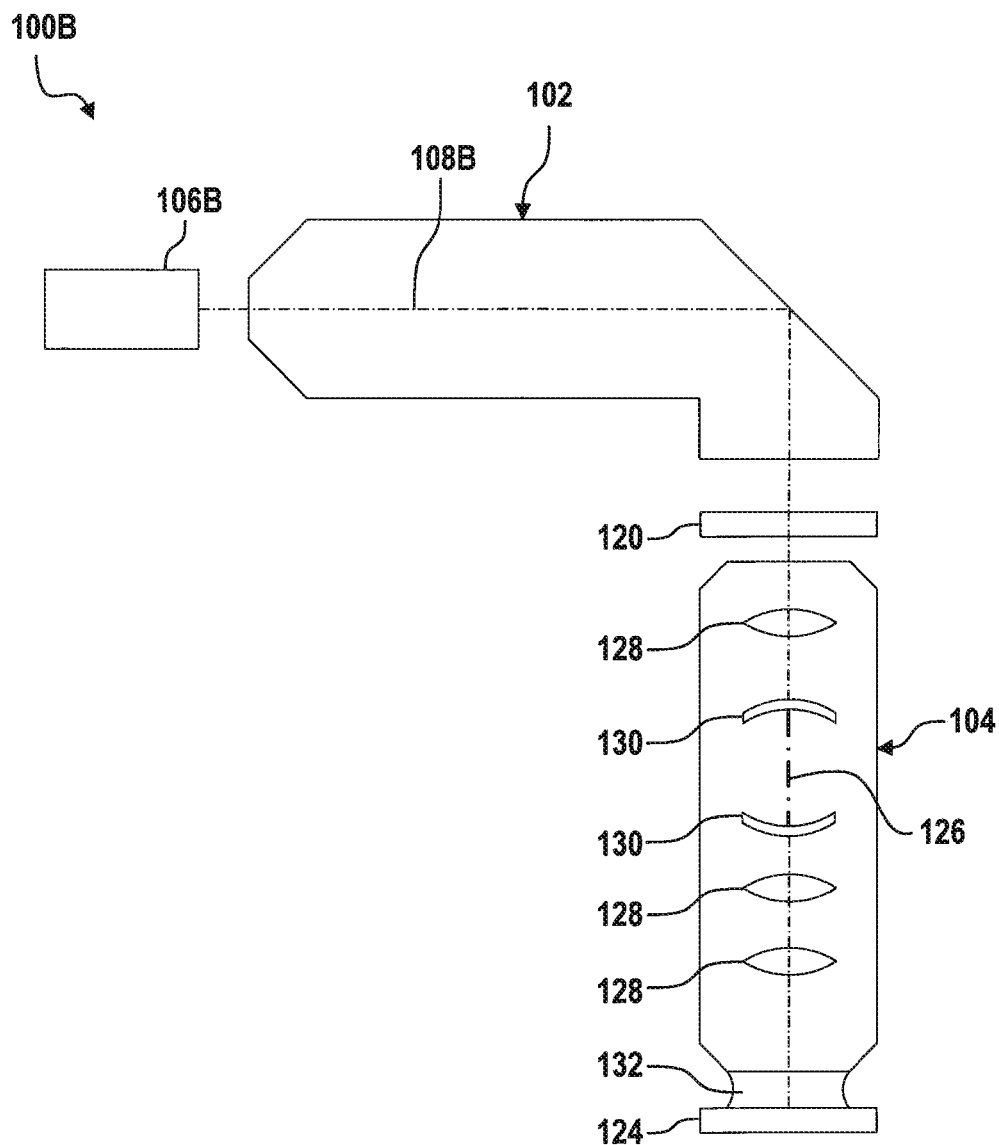
FIG. 1B shows a view of a DUV lithography apparatus.

FIG. 1B shows a schematic view of the DUV lithography apparatus 100B, which includes a beam-shaping and illumination system 102 and a projection system 104. DUV stands for "deep ultraviolet" and refers to a wavelength of the working light of between 30 and 250 nm.

The DUV lithography apparatus 100B has a DUV light source 106B. By way of example, an ArF excimer laser that emits radiation 108B in the DUV range at 193 nm, for example, can be provided as the DUV light source 106B.

The beam-shaping and illumination system 102 illustrated in FIG. 1B guides the DUV radiation 108B onto a photomask 120. The photomask 120 is embodied as a transmissive optical element and can be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to the optical axis 126 of the projection system 104. It should be noted that the number of lens elements and mirrors of the DUV lithography apparatus 100B is not restricted to the number represented. A greater or lesser number of lens elements and/or mirrors can also be provided. Furthermore, the mirrors are generally curved on their front face for beam shaping.

An air gap between the last lens element 128 and the wafer 124 can be replaced by a liquid medium 132 which has a refractive index of greater than 1. The liquid medium can be high-purity water, for example. Such a construction is also referred to as immersion lithography and has an increased photolithographic resolution.

Figure 2A:
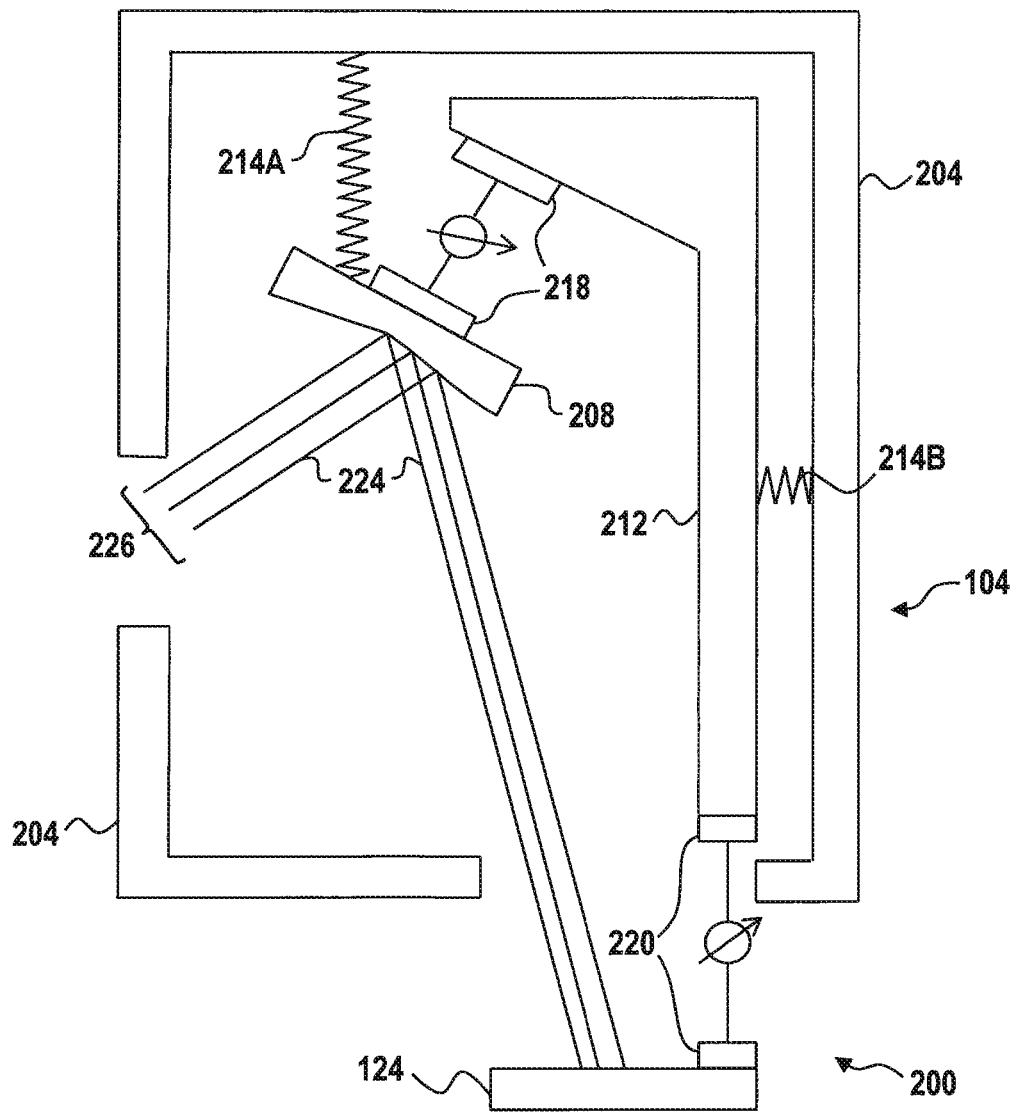
FIG. 2A shows a first embodiment of a lithography system.

FIG. 2A shows a first embodiment of a lithography system 200 having the projection lens 104 and a wafer 124. The projection lens 104 includes a carrying frame 204, an optical element 208 (in the present case also referred to as first optical element), a sensor subframe 212 (in the present case also referred to as first sensor subframe), a sensor 218 (in the present case also referred to as first sensor) configured to detect a position of the optical element 208 with respect to the sensor subframe 212, and a sensor 220 configured to detect a position of the wafer 124 with respect to the sensor subframe 212.

By way of example, the projection lens 104 includes only a single sensor subframe 212. In this case, the sensor subframe 212 can be referred to as sensor frame 212. Furthermore, the sensor subframe 212 can be referred to for example as sensor frame. The sensor subframe 212 is wholly or partly enclosed by the carrying frame 204. By way of example, the optical element 208 is linked or mounted with the aid of a connecting or carrying structure 214A at the carrying frame 204, wherein the optical element 208 is preferably mounted in such a way that in each case a controlled relative movement with respect to the carrying frame 204 can be performed. The sensor subframe 212 is connected to the carrying frame 204 in an oscillation-decoupled manner with the aid of a mounting 214B.

The optical element 208 at least partly defines a beam path 224 of the projection lens 104. The optical element 208 is arranged for example as the last optical element in the beam path 224 upstream of the wafer 124. Thus a working light 226 is incident on the wafer 124 directly from the optical element 208.

It goes without saying that a multiplicity of optical elements (not shown in FIG. 2A) can be referenced to the sensor subframe 212. By way of example, the projection lens 104 includes a multiplicity of sensors (not shown in FIG. 2A) configured to detect positions of the multiplicity of optical elements relative to the sensor subframe 212. By way of example, the projection lens 104 includes exactly 2, 3, 4, 5, 6, 7, 8, 9, 10, 11, 12, 13 or 14 optical elements that are referenced to the sensor subframe 212.

Figure 2B:
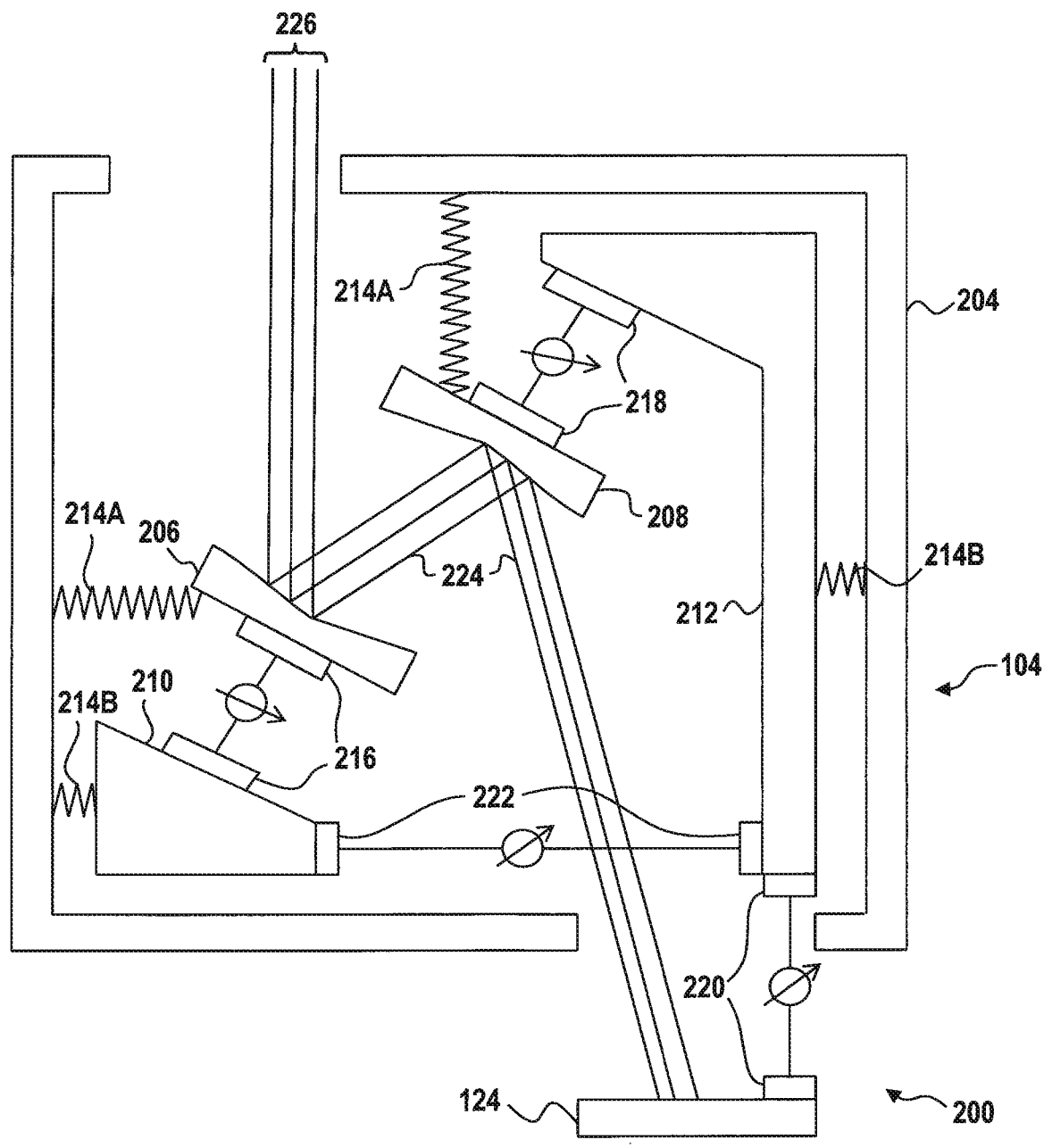
FIG. 2B shows a second embodiment of a lithography system.

FIG. 2B shows a second embodiment of a lithography system 200 having the projection lens 104 and a wafer 124. The projection lens 104 includes the carrying frame 204, an optical element 206 (in the present case also referred to as second optical element), the optical element 208 (in the present case also referred to as first optical element), a sensor subframe 210 (in the present case also referred to as second sensor subframe) and the sensor subframe 212 (in the present case also referred to as first sensor subframe). The optical element 206, the optical element 208, the sensor subframe 210 and the sensor subframe 212 can be arranged for example geometrically within the carrying frame 204. By way of example, the optical elements 206, 208 are linked or mounted in each case with the aid of a connecting or carrying structure 214A at the carrying frame 204, wherein the optical elements 206, 208 are preferably mounted in such a way that in each case a controlled relative movement with respect to the carrying frame 204 can be performed. The sensor subframes 210, 212 are connected to the carrying frame 204 in each case in an oscillation-decoupled manner with the aid of a mounting 214B.

Furthermore, the projection lens 104 includes a sensor 216 configured to detect a position of the optical element 206 with respect to the sensor subframe 210. For an accurate position determination, the sensor 216 can detect for example three translational degrees of freedom and three rotational degrees of freedom of the optical element 206 with respect to the sensor subframe 210. Consequently, a plurality of distances and angles between the measurement objects can be determined. In this case, an angle change can also be referred to as relative tilting. The sensor 216 is arranged on the sensor subframe 210 and connected thereto, wherein, depending on the type of sensor, a part of the sensor 216 can also be arranged on the optical element 206. Alternatively, the sensor 216 can also just be arranged on the optical element 206 and connected thereto. In other words, the optical element 206 is referenced to the sensor subframe 210 with the aid of the sensor 216.

Furthermore, the projection lens 104 includes the sensor 218 configured to detect a position of the optical element 208 with respect to the sensor subframe 212. The statements in respect of the optical element 206, the sensor subframe 210 and the sensor 216 are correspondingly applicable to the optical element 208, the sensor subframe 212 and the sensor 218.

Furthermore, the projection lens 104 includes the sensor 220 configured to detect the position of the wafer 124 with respect to the sensor subframe 212. The sensor 220 is arranged on the sensor subframe 212 and connected thereto, wherein, depending on the type of sensor, a part of the sensor 220 can also be arranged on the wafer 124, wherein the wafer 124 is arranged outside the carrying frame 204. Alternatively, the sensor 220 can also just be arranged on the wafer 124 and connected thereto, wherein in this case the lithography system 200 can include the sensor 220 and not the projection lens 104. In other words, the wafer 124 is referenced to the sensor subframe 212 with the aid of the sensor 220. Thus the optical device 208 and the wafer 124 are referenced to exactly one sensor subframe 212. The sensor subframe 212 is embodied in particular as a stiff and compact element.

Furthermore, the projection lens 104 moreover includes a sensor 222 (in the present case also referred to as sixth sensor) configured to detect a position of the sensor subframe 210 with respect to the sensor subframe 212. The description in respect of the sensor 216 is correspondingly applicable to the sensor 222.

Detecting a position of one element (e.g. optical element, wafer, reticle, sensor subframe, etc.) with respect to another element (e.g. optical element, wafer, reticle, sensor subframe, etc.) in the present case is also referred to as referencing (indicated by a circle and an arrow passing diagonally through the circle in FIGS. 2A, 2B, 3 and 4). Even if not described or illustrated in the respective figure, one sensor or a plurality of sensors is or are assumed for the referencing or detection of a position.

The optical elements 206, 208 at least partly define the beam path 224 of the projection lens 104. The optical element 208 is arranged as the last optical element in the beam path 224 upstream of the wafer 124. Thus the working light 226 is incident on the wafer 124 directly from the optical element 208.

The optical element 208 has an LoS sensitivity and the wafer 124 has an LoS sensitivity. Optical elements, a reticle and/or wafers that are referenced to a sensor subframe can be combined as a group, wherein a measurement error of a sensor between this group and the remaining lens (remaining beam path 224 defining optical elements) acts for example in a manner like a sum of the LoS sensitivities of all the elements of the group. In the case of the projection lens 104 shown in FIG. 2A or 2B, for example the LoS sensitivity of the optical element 208 has a different sign from that of the LoS sensitivity of the wafer 124. This has the advantage that the LoS sensitivities almost completely compensate for one another. By way of example, a sum formed from the LoS sensitivity of the optical element 208 and of the wafer 124 has an absolute value of less than 0.5, less than 0.2, less than 0.1 or less than 0.01.

Figure 3:
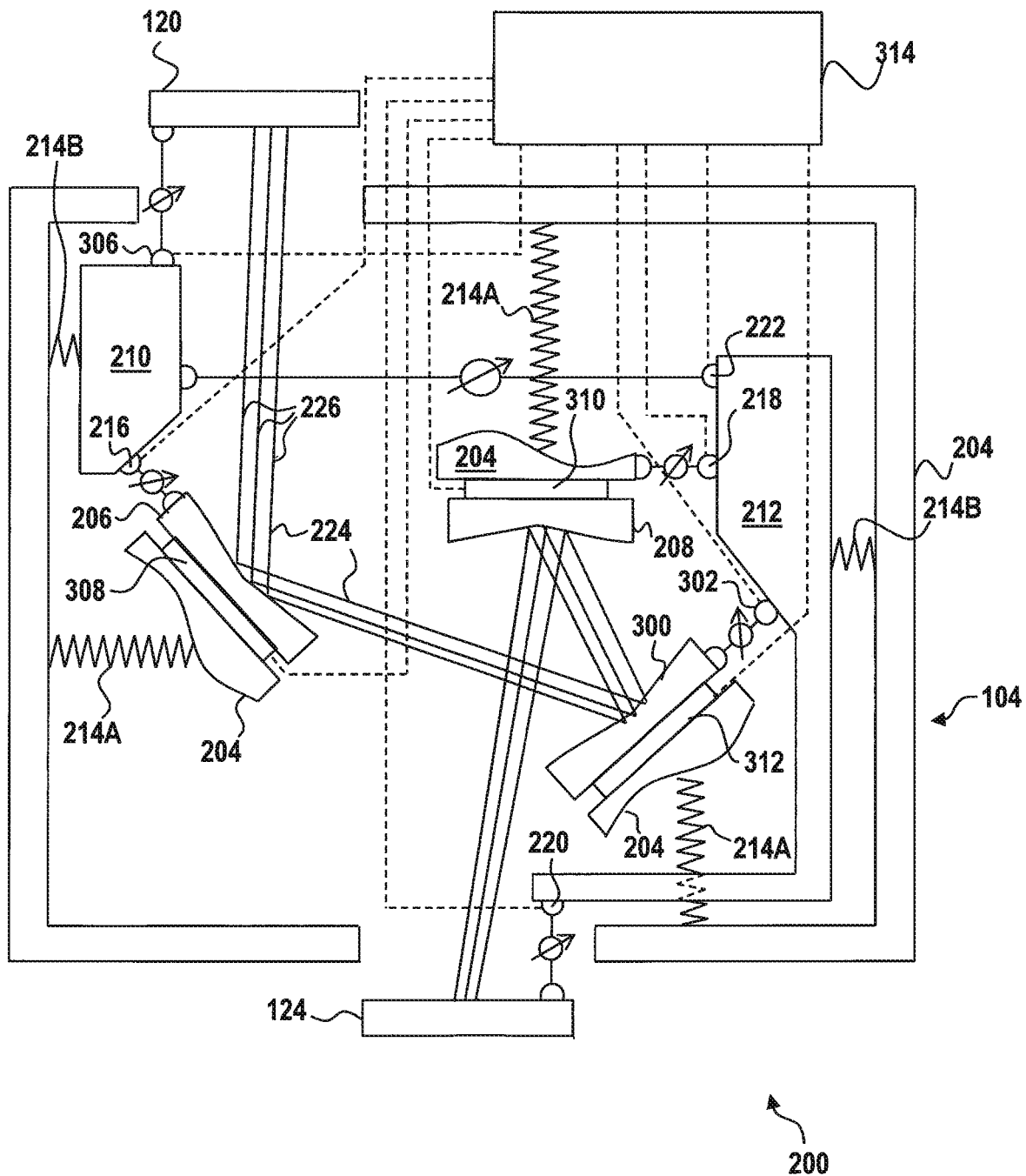
FIG. 3 shows a third embodiment of the lithography system.

FIG. 3 shows a third embodiment of the lithography system 200. In contrast to FIG. 2B, the projection lens 104 includes an optical element 300 (in the present case also referred to as third optical element) that further defines the beam path 224. Furthermore, the projection lens 104 includes a sensor 302 (in the present case also referred to as fourth sensor) configured to detect a position of the optical element 300 with respect to the sensor subframe 212. The description given above in respect of the sensor 216 is correspondingly applicable to the sensor 302 as well. Thus the optical element 208, the optical element 300 and the wafer 124 are referenced to a single sensor subframe 212 from a plurality of oscillation-decoupled sensor subframes 210, 212.

The optical element 300 is arranged as the penultimate optical element in the beam path 224. Thus the working light 226 is incident from the optical element 300 directly on the optical element 208 and from the optical element 208 directly on the wafer 124. Referencing the penultimate optical element 300, the last optical element 208 and the wafer 124 to a single sensor subframe 212 has the advantage that LoS sensitivities of these elements at least for a translational shift almost completely compensate for one another.

The lithography system 200 includes the reticle 120, wherein the projection lens 104 includes a sensor 306 (in the present case also referred to as fifth sensor) configured to detect a position of the reticle 120 with respect to the sensor subframe 210. The sensor 306 is arranged on the sensor subframe 210 and connected thereto, wherein, depending on the type of sensor, a part of the sensor 306 can also be arranged on the reticle 120, wherein the reticle 120 is arranged outside the carrying frame 204. Alternatively, the sensor 306 can also just be arranged on the reticle 120 and connected thereto, wherein for example in this case the lithography system 200 can include the sensor 306. In other words, the reticle 120 is referenced to the sensor subframe 210 with the aid of the sensor 306 and the optical element 206 is referenced to the sensor subframe 210 with the aid of the sensor 216. Thus the reticle 120 and the optical element 206 form a group in which the measurement error of a sensor between this group and the remaining lens has an effect with the sum of the LoS sensitivities (of the reticle 120 and of the optical element 206). Preferably, an LoS sensitivity of the reticle 120 has a different sign from that of the LoS sensitivity of the optical element 206, such that they mutually compensate for one another at least in part.

In addition, the projection lens 104 includes an actuator 308 (in the present case also referred to as first actuator) configured to position the optical element 206 with respect to the carrying frame 204. Furthermore, the projection lens 104 includes an actuator 310 configured to position the optical element 208 with respect to the carrying frame 204. Moreover, the projection lens 104 includes an actuator 312 configured to position the optical element 300 with respect to the carrying frame 204.

Furthermore, the projection lens 104 includes a control device 314, which is configured to drive the actuator 308 for positioning the optical element 206 depending on the position detected by the sensor 216, the position detected by the sensor 218 and the position detected by the sensor 222. Furthermore, the control device 314 is configured to drive the actuator 312 for positioning the optical element 300 depending on the position detected by the sensor 302 and the position detected by the sensor 218. Furthermore, the control device 314 is configured to drive the actuator 310 for positioning the optical element 208 depending on the position detected by the sensor 218. In other words, by way of example, all the optical elements 206, 300 arranged in the beam path 224 follow the last optical element 208. Alternatively, the elements arranged in the beam path 224 could follow another optical element or the wafer 124. The communication of the sensors 216, 218, 220, 222, 302, 306 and of the actuators 308, 310, 312 with the control device 314 is indicated by dashed lines in FIG. 3.

By way of example, a sum formed from the LoS sensitivity of the optical element 208, of the wafer 124 and of the optical element 300 has an absolute value of less than 0.5, less than 0.2, less than 0.1 or less than 0.01.

The actuators 308, 310, 312 are embodied for example as Lorenz actuators. The optical elements 206, 208, 300 are embodied for example as mirrors M1-M6 and/or lens elements 128.

Although not illustrated, by way of example all the optical elements from FIGS. 1A, 1B, 2A, 2B and 4 can be actuated with the aid of actuators. Correspondingly, a control device 314 is always present as well. Furthermore, by way of example, corresponding sensors are always provided for referencing the optical elements.

Figure 4:
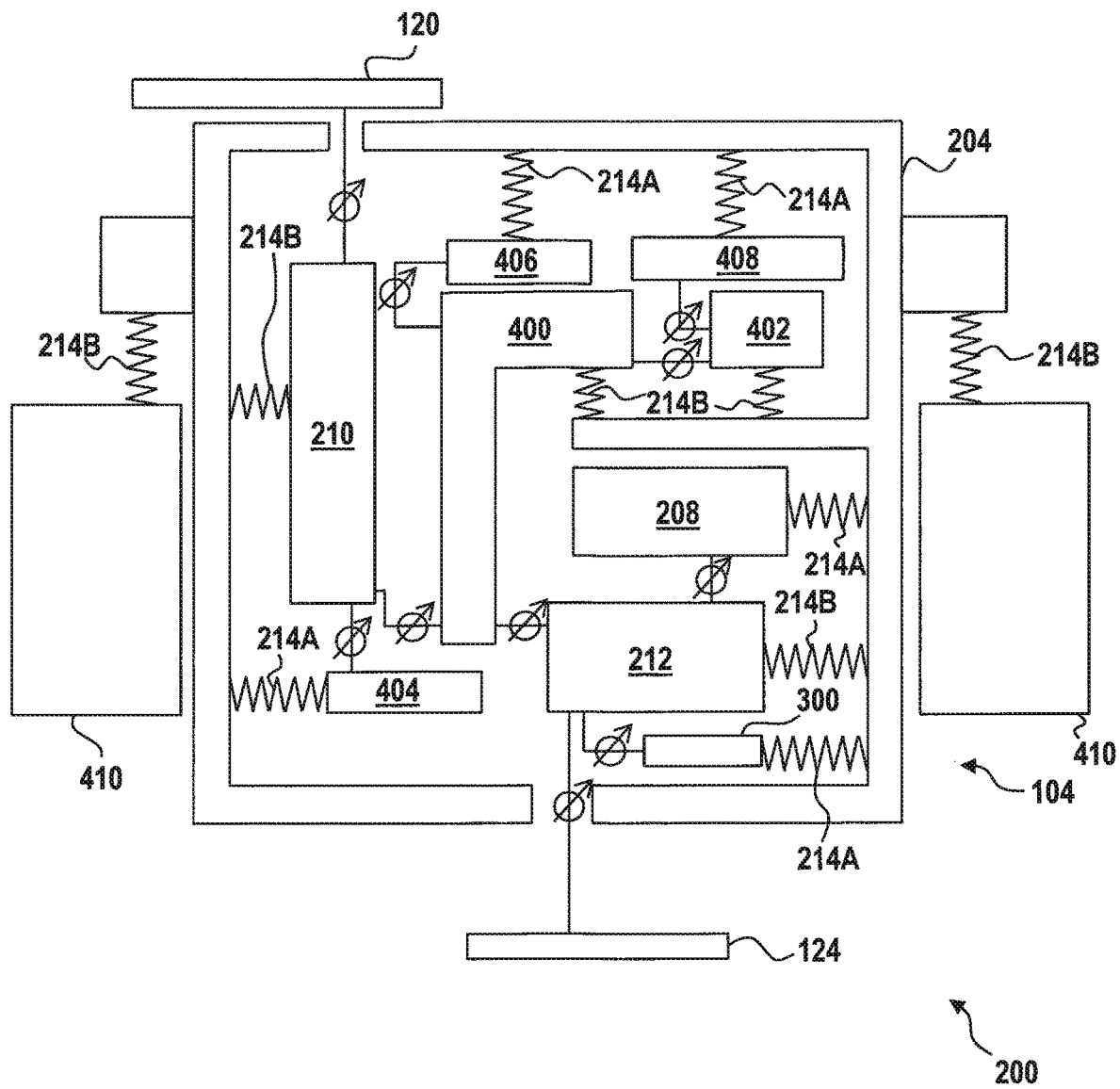
FIG. 4 shows a fourth embodiment of the lithography system.

FIG. 4 shows a fourth embodiment of the lithography system 200. In contrast to FIG. 3, no sensors, no actuators, no beam path and no control device are illustrated. Furthermore, besides the sensor subframes 210, 212, the lithography system 200 includes a sensor subframe 400 and a sensor subframe 402. The reticle 120 and a group 404 (in the present case also referred to as first group) of optical elements, including the optical element 206 and a further optical element, are referenced to the sensor subframe 210. The further optical element is arranged in the beam path 224 at the second location, such that working light 226 from the optical element 206 is incident directly on the further optical element. A group 406 of optical elements is referenced to the sensor subframe 400, wherein the group 406 includes optical elements arranged at the third location and at the fourth location in the beam path 224. Furthermore, a group 408 of optical elements is referenced to the sensor subframe 402, wherein the group 408 includes optical elements arranged at the fifth location, the sixth location, the seventh location and the eighth location in the beam path 224. As already shown in FIG. 3, the optical element 208, the optical element 300 and the wafer 124 are referenced to the sensor subframe 212. In this case, the optical element 300 is arranged at the ninth location in the beam path 224 and the optical element 208 is arranged at the tenth location in the beam path 224. Consequently, the projection lens 104 includes ten optical elements. By way of example, in each case separate linking structures 214A to the carrying frame 204 can be provided for all the optical elements.

In contrast to FIG. 3, a position of the sensor subframe 210 with respect to the sensor subframe 400, a position of the sensor subframe 402 with respect to the sensor subframe 400 and a position of the sensor subframe 212 with respect to the sensor subframe 400 are detected.

The carrying frame 204 is connected to a further carrying structure 410, in particular a base frame or a base, via a mounting 214B, wherein the connection is embodied in particular as an oscillation-decoupled connection.

Preferably, the projection lens 104 includes a mirror configuration including six normal incidence mirrors. Alternatively, four normal incidence mirrors and four grazing incidence mirrors 122 can be present. As a further alternative, the projection lens 104 can include three normal incidence mirrors and seven grazing incidence mirrors 122. The optical elements 206, 208, 300 are selected from the mirrors of the mirror configuration.

Figure 5:
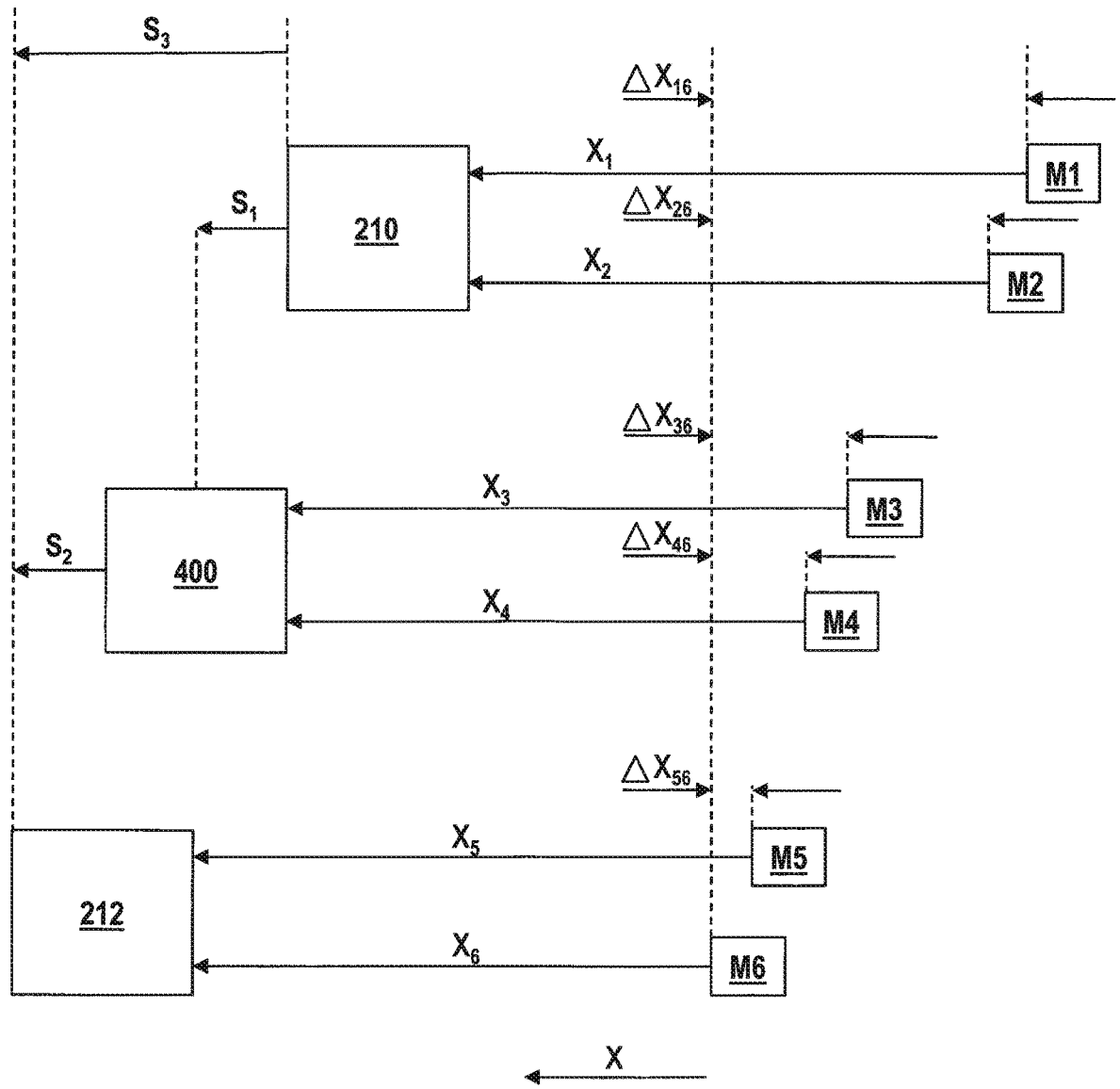
FIG. 5 schematically shows a position determination for optical elements.

FIG. 5 shows a scheme for the position determination of the optical elements. The mirrors M1-M6 from FIG. 1A were selected merely by way of example as optical elements, wherein the mirrors M1 and M2 are referenced to the sensor subframe 210, the mirrors M3 and M4 are referenced to the sensor subframe 400 and the mirrors M5 and M6 are referenced to the sensor subframe 212.

For the actuation of the optical elements M1-M6, all the optical elements are intended to follow the mirror M6, for example. The distances between the optical elements M1-M6 and the respective sensor subframe 210, 212, 400 as considered in a spatial direction X are designated by $X_1$-$X_6$, wherein the distances are detected by corresponding sensors. A distance in the spatial direction X between the sensor subframe 210 and the sensor subframe 400 is designated as $S_1$ and between the sensor subframe 400 and sensor subframe 212 as $S_2$, wherein corresponding sensors detect the distances $S_1$, $S_2$. A distance $S_3$ between the sensor subframe 210 and sensor subframe 212 is not detected directly, for example, but rather calculated by addition of the distances S1 and S2, such that mention can be made of a virtual sensor between the sensor subframe 210 and the sensor subframe 212, for example.

The alignment (actuation) of the mirrors M1 to M5 in the X-direction involves determining for example respective distances $\Delta X_{56}$, $\Delta X_{46}$, $\Delta X_{36}$, $\Delta X_{26}$ and $\Delta X_{16}$ between the mirror M6 and the mirrors M1-M5. In this case, it holds true that:

$$\Delta X_{56}=X_5-X_6,$$

$$\Delta X_{46}=S_2+X_4-X_6,$$

$$\Delta X_{36}=S_2+X_3-X_6,$$

$$\Delta X_{26}=S_1+S_2+X_2-X_6, \text{ and}$$

$$\Delta X_{16}=S_1+S_2+X_1-X_6.$$

Since the distances $\Delta X_{56}$, $\Delta X_{46}$, $\Delta X_{36}$, $\Delta X_{26}$ and $\Delta X_{16}$ between the mirror M6 and the mirrors M1-M5 are determined indirectly, mention can be made of virtual sensors between the mirrors M1-M6. A measurement error occurs for each actual measurement of the distances $X_1$-$X_6$, $S_1$, $S_2$.

It has been recognized that the distances X1 to X6 must always be measured for corresponding systems and that the corresponding measurement errors (which occur during normal operation of a sensor) cannot be avoided. An incorrect position of the optical elements M1-M6 on account of the measurement errors leads to a corresponding image vibration since the measurement errors occur in particular randomly with respect to one another, and, consequently, the mirrors M1-M6 have random actual positions within a certain tolerance range. Moreover, it has been recognized that a reduction of measurements $S_1$, $S_2$ between the sensor subframes 210, 400, 212 leads to a reduction of the measurement error. This is intrinsically a factor that opposes increasing and, under certain circumstances, supports reducing the number of sensor subframes. Nevertheless, it should be taken into consideration that a division of the sensor frame into a multiplicity of sensor subframes is advantageous for reducing the quasi-static deformation.

Furthermore, it has been recognized that measurement errors which occur during the measurement of the distances $S_1$, $S_2$ have a small influence on the image effect and thus on the image vibration when the sum of the LoS sensitivities of the optical elements M1, M2, M3, M4 that are referenced to a respective sensor subframe 210, 400 is as small as possible. This stems from the fact that the same measurement error that results from the distance measurement of the distance S2 influences a respective positioning manipulated variable of the mirror M3 and of the mirror M4. In other words, the mirror M3 and the mirror M4 have incorrect positions (considered in isolation for the measurement error resulting from the measurement of the distance S2) which have the same direction and the same absolute value, such that the incorrect positions compensate for one another in the image effect on account of compensating LoS sensitivities of the mirrors M3 and M4. Analogously thereto, the measurement errors from the distance measurements of the distances $S_1$, $S_2$ (as $S_3$) simultaneously influence the respective positioning manipulated variable of the mirror M1 and of the mirror M2. Furthermore, it is conceivable to provide such sensors for the position detection of the optical elements relative to a sensor subframe which simultaneously cause measurement errors which have an identical sign and a similar absolute value, such that a compensating effect in the image effect occurs when the measurement errors influence the positioning manipulated variables of the mirrors.

Consequently, via a skilful arrangement of the referencings of the optical elements M1-M6 to the sensor subframes 210, 400, 212, it is possible to reduce the individual sums of the LoS sensitivities, in particular by grouping optical elements having LoS sensitivities having different signs and, if appropriate, having absolute values of similar magnitude (e.g. in the case of exactly two optical elements). Since a change in the number of sensor subframes or a change in the referencing of an optical element has system- or design-dictated restrictions, these must correspondingly influence a selection process.

Figure 6:
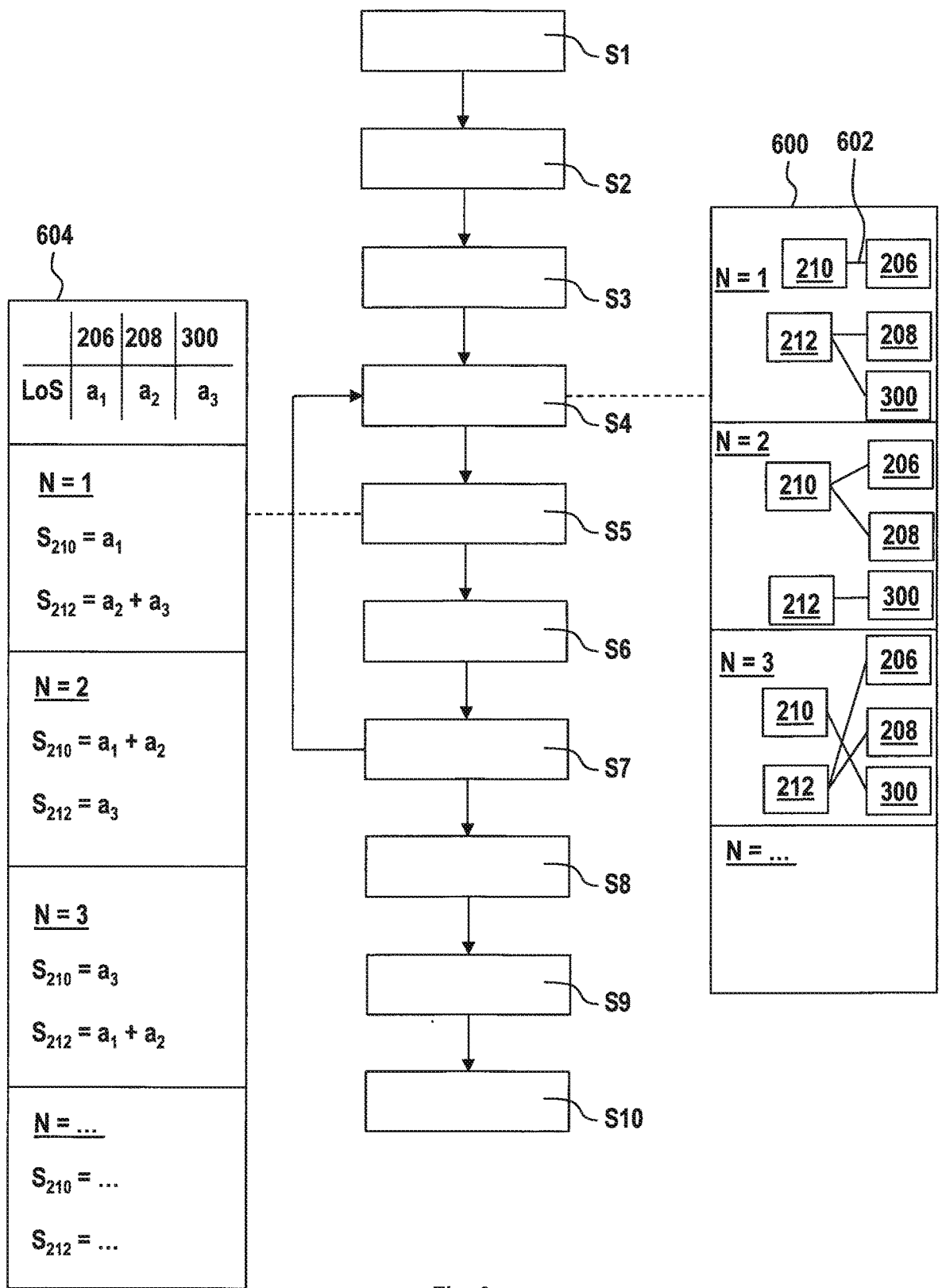
FIG. 6 shows a block diagram of a method for producing the lithography system.

FIG. 6 shows a block diagram of a method for producing the lithography system 200, in particular the projection lens 104.

A step S1 involves arranging the optical elements 206, 208 for defining the beam path 224. By way of example, 6, 8 or 10 optical elements, in particular mirrors, can also be arranged.

A step S2 involves providing the wafer 124 at the end of the beam path 224 and/or the optical element 300 for further defining the beam path 224. By way of example, step S2 can additionally involve providing the reticle 120.

A step S3 involves determining the LoS sensitivities of the optical elements 206, 208 and also of the wafer 124 and/or of the optical element 300. Determining the LoS sensitivities is carried out separately in particular for a constant numerical aperture and in particular for shifts in three spatial directions and for tilts about three axes. By way of example, the LoS sensitivities of all the elements (reticle, wafer, all optical elements provided) are determined. Since it is advantageous for LoS sensitivities of the elements (in particular of reticle, wafer, and optical elements) to have different signs, steps S1 and S2 can be carried out once again or influenced until the determined LoS sensitivities of the elements have different signs. In other words, at least two elements which have LoS sensitivities having different signs should be grouped.

A step S4 involves assigning the LoS sensitivities to the sensor subframe 210 and sensor subframe 212 in accordance with a first of N combination possibilities. The combination possibilities which are possible purely computationally can be reduced for example by system- or design-dictated restrictions. A table 600 from FIG. 6 visualizes for example three of N combination possibilities for two sensor subframes 210, 212 and three optical elements 206, 208, 300. Referencings 602 of the optical elements 206, 208, 300 are represented here in each case with the aid of a connecting line.

A step S5 involves summing the LoS sensitivities assigned to a respective sensor subframe 210, 212, provided that not just one individual LoS sensitivity is assigned. This summing is carried out separately for the LoS sensitivities of the different shifts and tilts. By way of example, this can be carried out just for one representative shift or tilt or for shifts in three spatial directions and tilts about three axes. A table 604 from FIG. 6 illustrates by way of example a summation for three of N combination possibilities for two sensor subframes 210, 212 and three optical elements 206, 208, 300. The LoS sensitivities of the three optical elements 206, 208, 300 are designated by way of example by $a_1$-$a_3$. A sum $S_{210}$ of the LoS sensitivities of the elements (in particular reticle, wafer, optical elements) which are referenced to the sensor subframe 210 is formed. Furthermore, a sum $S_{212}$ of the LoS sensitivities of the elements (in particular reticle, wafer, optical elements) that are referenced to the sensor subframe 212 is formed. If further sensor subframes 400, 402 are present, in each case sums $S_{400}$, $S_{402}$ (not shown in FIG. 6) of the LoS sensitivities of the elements (reticle, wafer, optical elements) that are referenced to the further sensor subframes 400, 402 are correspondingly formed as well. In particular, 2 to 6 dimensional vectors for the LoS sensitivities can also be present, which are correspondingly summed.

A step S6 involves storing the sums $S_{210}$, $S_{212}$, $S_{400}$, $S_{402}$ and individual LoS sensitivities $S_{210}$, $S_{212}$, $S_{400}$, $S_{402}$. This is done for example for a later comparison.

A step S7 involves repeating steps S4-S6 up to and including the Nth combination possibility.

A step S8 involves selecting one combination possibility from the N combination possibilities depending on the stored sums $S_{210}$, $S_{212}$, $S_{400}$, $S_{402}$ and individual LoS sensitivities $S_{210}$, $S_{212}$, $S_{400}$, $S_{402}$. By way of example, absolute values of the sums $S_{210}$, $S_{212}$, $S_{400}$, $S_{402}$ and individual LoS sensitivities $S_{210}$, $S_{212}$, $S_{400}$, $S_{402}$ of a respective combination possibility can be formed and subsequently be summed in order to form a total sum. Alternatively, the absolute values formed can be weighted with a respective factor before the step of forming the total sum in order to take account of system- or design-dictated boundary conditions or restrictions, for example. Correspondingly, absolute values of sum vectors $S_{210}$, $S_{212}$, $S_{400}$, $S_{402}$ can also be formed and, if appropriate, weighted with a factor. By way of example, that combination possibility from the N combination possibilities which has the smallest total sum can subsequently be selected.

A step S9 involves providing sensors 216, 218, 220, 302, 306 configured to detect a respective position of the optical elements 206, 208 and also of the wafer 124 and/or of the optical element 300 with respect to a reference.

A step S10 involves selecting the sensor subframe 210 or sensor subframe 212 as reference depending on the selected combination possibility. If further sensor subframes 400, 402 are present, they are also correspondingly taken into account concomitantly in the selection process.

Individual or a plurality of steps S1-S10 can be performed in a software-based simulation model.

Although the present disclosure has been described on the basis of exemplary embodiments, it is modifiable in diverse ways.

LIST OF REFERENCE SIGNS

100A EUV lithography apparatus
100B DUV lithography apparatus
102 Beam-shaping and illumination system
104 Projection system, projection lens,
106A EUV light source
106B DUV light source
108A EUV radiation
108B DUV radiation
110-118 Mirrors
120 Photomask, reticle
122 Mirror, grazing incidence mirror
124 Wafer
126 Optical axis
128 Lens element
130 Mirror
132 Immersion liquid
200 Lithography system
204 Carrying frame
206 Optical element
208 Optical element
210 Sensor subframe
212 Sensor subframe
214A Connecting structure, carrying structure
214B Mounting
216 Sensor
218 Sensor
220 Sensor
222 Sensor
224 Beam path
226 Working light
300 Optical element
302 Sensor
306 Sensor
308 Actuator
310 Actuator
312 Actuator
314 Control device
400 Sensor subframe
402 Sensor subframe
404 Group
406 Group
408 Group
410 Carrying structure, base frame
600 Table
602 Referencing
604 Table
N Number of combination possibilities
$S_{210}$ Sum
$S_{212}$ Sum
$S_{400}$ Sum
$S_{402}$ Sum
X Spatial direction
$\Delta X_{16}$ Distance
$\Delta X_{26}$ Distance
$\Delta X_{36}$ Distance
$\Delta X_{46}$ Distance
$\Delta X_{56}$ Distance
$a_1$-$a_3$ LoS sensitivities
M1-M6 Mirrors
S1-S10 Method steps
$S_1$-$S_3$ Distance
$X_1$-$X_6$ Distance

What is claimed is:

1. A lithography system, comprising:
   a projection lens, comprising:
      a first optical element;
      a first sensor subframe;
      a first sensor which is configured to detect a position of the first optical element with respect to the first sensor subframe; and
      a second sensor which is configured to detect a position of a wafer with respect to the first sensor subframe,
   wherein:
      the first optical element has a line-of-sight sensitivity having a first sign;
      the wafer has a line-of-sight sensitivity having a second sign; and
      the first sign is different from the second sign.

2. The lithography system of claim 1, wherein:
   the projection lens further comprises a second optical element;
   the first and second optical elements at least partly define a beam path of the projection lens; and
   the first optical element is the last optical element in the beam path upstream of the wafer.

3. The lithography system of claim 1, wherein the projection lens further comprises:
   a second optical element;
   a second sensor subframe which is oscillation-decoupled from the first sensor subframe; and
   a third sensor which is configured to detect a position of the second optical element with respect to the second sensor subframe.

4. The lithography system of claim 3, wherein:
   the first and second optical elements at least partly define a beam path of the projection lens; and
   the first optical element is the last optical element in the beam path upstream of the wafer.

5. The lithography system of claim 3, further comprising the wafer.

6. The lithography system of claim 3, wherein:
   the projection lens further comprises a third optical element and a fourth sensor;
   the first, second and third optical element at least partly define a beam path of the projection lens;
   the fourth sensor is configured to detect a position of the third optical element with respect to the first sensor subframe; and
   the third optical element is the penultimate optical element in the beam path.

7. The lithography system of claim 6, wherein the first optical element is the last optical element in the beam path upstream of the wafer.

8. The lithography system of claim 7, wherein the projection lens further comprises a fifth sensor which is configured to detect a position of the reticle with respect to the second sensor subframe.

9. The lithography system of claim 8, wherein the projection lens further comprises a sixth sensor which is configured to detect a position of the second sensor subframe with respect to the first sensor subframe.

10. The lithography system of claim 6, wherein the projection lens further comprises a fifth sensor which is configured to detect a position of the reticle with respect to the second sensor subframe.

11. The lithography system of claim 10, further comprising a reticle.

12. The lithography system of claim 10, wherein the projection lens further comprises a sixth sensor which is configured to detect a position of the second sensor subframe with respect to the first sensor subframe.

13. The lithography system of claim 12, wherein the projection lens further comprises:
a carrying frame;
a first actuator which is configured to position the second optical element with respect to the carrying frame;
a second actuator which is configured to position the first optical element with respect to the carrying frame; and
a control device which is configured to drive the first actuator to position the second optical element depending on: i) the position detected by the third sensor; ii) the position detected by the first sensor; and iii) the position detected by the sixth sensor; and
the control device is configured to drive the second actuator to position the first optical element depending on the position detected by the first sensor.

14. The lithography system of claim 3, wherein:
the first optical element comprises a mirror or a lens;
the second optical element comprises a mirror or a lens; and
the third optical element comprises a mirror or a lens.

15. The lithography system of claim 3, wherein:
the first optical element comprises a mirror;
the second optical element comprises a mirror; and
the third optical element comprises a mirror.

16. The lithography system of claim 15, wherein:
the projection lens comprises a mirror configuration which comprises the first, second and third mirrors; and
at least one of the following holds:
the mirror configuration comprises six normal incidence mirrors; the mirror configuration comprises four normal incidence mirrors and four grazing incidence mirrors; and
the mirror configuration comprises three normal incidence mirrors and seven grazing incidence mirrors.

17. The lithography system of claim 1, wherein a sum of a line-of-sight sensitivity of at least one member selected from the group consisting of the first optical element, the wafer and the third optical element has an absolute value of less than 0.5.

18. The lithography system of claim 1, wherein a sum of a line-of-sight sensitivity of at least one member selected from the group consisting of the first optical element, the wafer and the third optical element has an absolute value of less than 0.2.

19. A method, comprising:
a) arranging first and second optical element to define a beam path;
b) providing at least one member selected from the group consisting of a wafer at the end of the beam path and a third optical element for further defining the beam path;
c) determining the line-of-sight sensitivities of the first and second optical elements and also of the wafer and/or of the third optical element;
d) assigning the line-of-sight sensitivities to a first and second sensor subframe in accordance with a first of N combination possibilities;
e) summing the line-of-sight sensitivities assigned to a respective sensor subframe, provided that not just one individual line-of-sight sensitivity;
f) storing the sums and individual line-of-sight sensitivities;
g) repeating d)-f) up to and including the Nth combination possibility;
h) selecting a combination possibility from the N combination possibilities depending on the stored sums and individual line-of-sight sensitivities;
i) providing sensors to detect a respective position of the first and second optical element and also of the wafer and/or third optical element with respect to a reference; and
j) selecting the first or second sensor subframe as reference depending on the selected combination possibility.

20. The method of claim 19, wherein the line-of-sight sensitivities determined in c) have different signs.

* * * * *